US 6,458,714 B1

(12) United States Patent
Powell et al.

(10) Patent No.: US 6,458,714 B1
(45) Date of Patent: Oct. 1, 2002

(54) METHOD OF SELECTIVE OXIDATION IN SEMICONDUCTOR MANUFACTURE

(75) Inventors: Don Carl Powell; Ron Weimer, both of Boise; Lyle Breiner, Meridian; Howard Rhodes, Boise; Jeff McKee, Meridian; David Kubista, Nampa, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/721,839

(22) Filed: Nov. 22, 2000

(51) Int. Cl.$^7$ ............................................. H01L 21/311
(52) U.S. Cl. ...................................................... 438/770
(58) Field of Search .................. 438/770, 773, 438/768

(56) References Cited

U.S. PATENT DOCUMENTS

| | | | |
|---|---|---|---|
| 4,621,277 A | 11/1986 | Ito et al. ................... 357/34 |
| 4,784,973 A | 11/1988 | Stevens et al. ............ 437/200 |
| 4,839,301 A | 6/1989 | Lee ........................... 437/29 |
| 4,980,307 A | 12/1990 | Ito et al. ................... 437/40 |
| 4,996,081 A | 2/1991 | Ellul et al. ................. 427/96 |
| 5,003,375 A | 3/1991 | Ichikawa ................... 357/71 |
| 5,057,449 A | 10/1991 | Lowrey et al. ............. 437/52 |
| 5,073,509 A | 12/1991 | Lee ........................... 437/34 |
| 5,094,712 A | 3/1992 | Becker et al. ............. 156/643 |
| 5,100,826 A | 3/1992 | Dennison ................... 437/52 |
| 5,132,756 A | 7/1992 | Matsuda .................. 357/23.1 |
| 5,177,027 A | 1/1993 | Lowrey et al. ............. 437/41 |
| 5,236,865 A | 8/1993 | Sandhu et al. ............ 437/174 |
| 5,240,874 A | 8/1993 | Roberts ..................... 437/69 |
| 5,264,724 A | 11/1993 | Brown et al. .............. 257/347 |
| 5,266,510 A | 11/1993 | Lee ........................... 437/44 |
| 5,272,367 A | 12/1993 | Dennison et al. ......... 257/306 |
| 5,306,951 A | 4/1994 | Lee et al. ................. 257/755 |
| 5,341,016 A | 8/1994 | Prall et al. ................. 257/412 |
| 5,345,104 A | 9/1994 | Prall et al. ................ 257/607 |
| 5,349,494 A | 9/1994 | Ando ....................... 361/322 |
| 5,360,769 A | 11/1994 | Thakur et al. ............ 437/239 |
| 5,376,593 A | 12/1994 | Sandhu et al. ............ 437/242 |
| 5,378,641 A | 1/1995 | Cheffings .................. 437/35 |

(List continued on next page.)

FOREIGN PATENT DOCUMENTS

| | | |
|---|---|---|
| EP | 0 926 741 A2 | 6/1999 |
| GB | 2 134 706 A | 8/1984 |
| JP | 1-94664 | 4/1989 |

OTHER PUBLICATIONS

Shimizu, et al., "Impact of Suface Proximity Gettering and Nitrided Oxide Side–Wall Spacer by Nitrogen Implantation on Sub–Quarter Micron CMOS LDD FETs" IEDM 95, pp. 859–862 (1995).

Wolf, S. and Tauber, R. N., *Silicon Pricessing for the VLSI Era. vol. 1, Processing Technology*, pp. 191–194.

Primary Examiner—David Nelms
Assistant Examiner—Quoc Hoang
(74) Attorney, Agent, or Firm—Knobbe, Martens, Olson & Bear, LLP

(57) ABSTRACT

Disclosed is a method of selective oxidation of components of a semiconductor transistor containing silicon in the presence of high conductivity metal or metal alloys. A high temperature annealing step allows hydrogen gas to permeate the surface of a metal or metal alloy and creates a hydrogen-terminated passivation layer that surrounds the metallic layer. This passivating layer protects the underlying metal or metal alloy from oxidation by oxygen or water and reduces any oxidized metal present back into the constituent metal or metal alloy. In a subsequent wet oxidation step the source and drain regions of a semiconductor transistor gate electrode are reoxidized without oxidation of the passivated metal or metal alloy. The process does not consume the metal or metal alloy layer, insures that the overall gate electrode resistance remains low, and preserves the desirable characteristics of the gate electrode that insure a quality component with superior longevity.

53 Claims, 7 Drawing Sheets

U.S. PATENT DOCUMENTS

| | | |
|---|---|---|
| 5,393,683 A | 2/1995 | Mathews et al. ............. 437/42 |
| 5,405,791 A | 4/1995 | Ahmad et al. ................ 437/34 |
| 5,407,870 A | 4/1995 | Okada et al. ............... 437/241 |
| 5,429,972 A | 7/1995 | Anjum et al. ................ 437/47 |
| 5,463,234 A | 10/1995 | Toriumi et al. ............. 257/296 |
| 5,472,896 A | 12/1995 | Chen et al. ................... 437/44 |
| 5,501,995 A | 3/1996 | Shin et al. .................... 437/41 |
| 5,545,289 A | 8/1996 | Chen et al. ............. 156/643.1 |
| 5,545,578 A | 8/1996 | Park et al. .................... 437/44 |
| 5,550,084 A | 8/1996 | Anjum et al. ............... 437/200 |
| 5,753,556 A | 5/1998 | Katada et al. .............. 438/302 |
| 5,756,392 A | 5/1998 | Lu et al. ..................... 438/592 |
| 5,811,865 A | 9/1998 | Hodges et al. ............. 257/411 |
| 5,837,585 A | 11/1998 | Wu et al. ................... 438/264 |
| 5,895,955 A | 4/1999 | Gardner et al. ............ 257/336 |
| 5,897,349 A | 4/1999 | Agnello ...................... 438/230 |
| 6,030,875 A | 2/2000 | May et al. .................. 438/302 |
| 6,162,741 A * | 12/2000 | Akasaka et al. ............ 438/773 |
| 6,197,702 B1 * | 3/2001 | Tanabe et al. .............. 438/773 |

\* cited by examiner

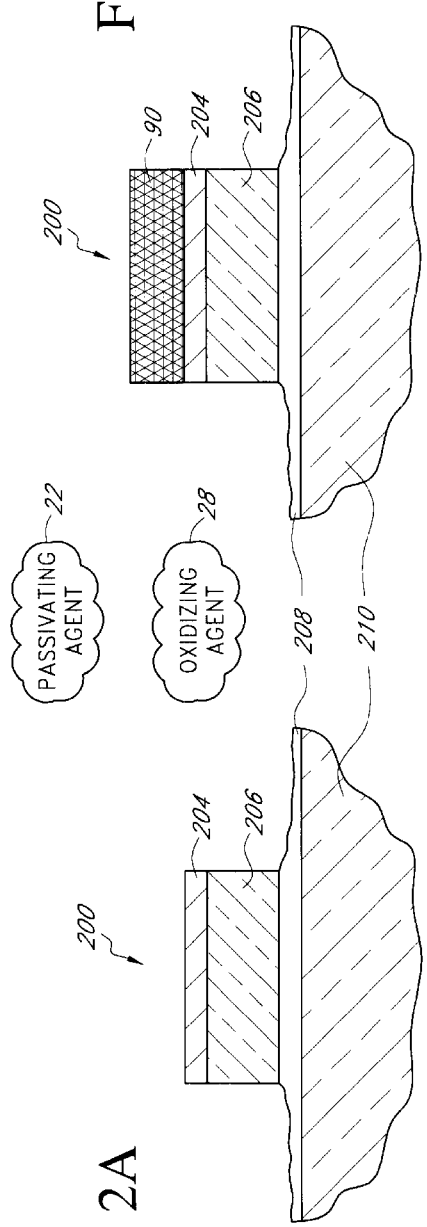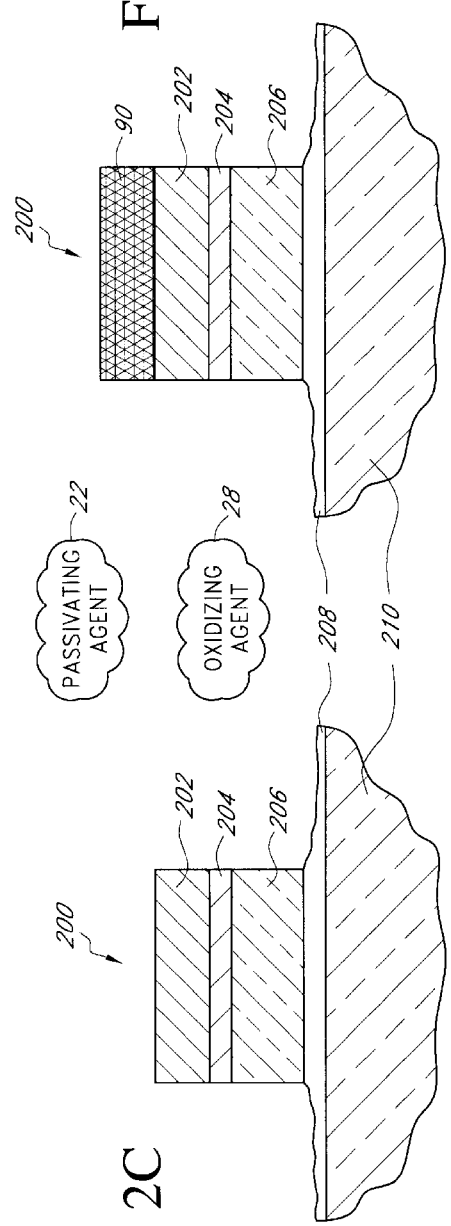

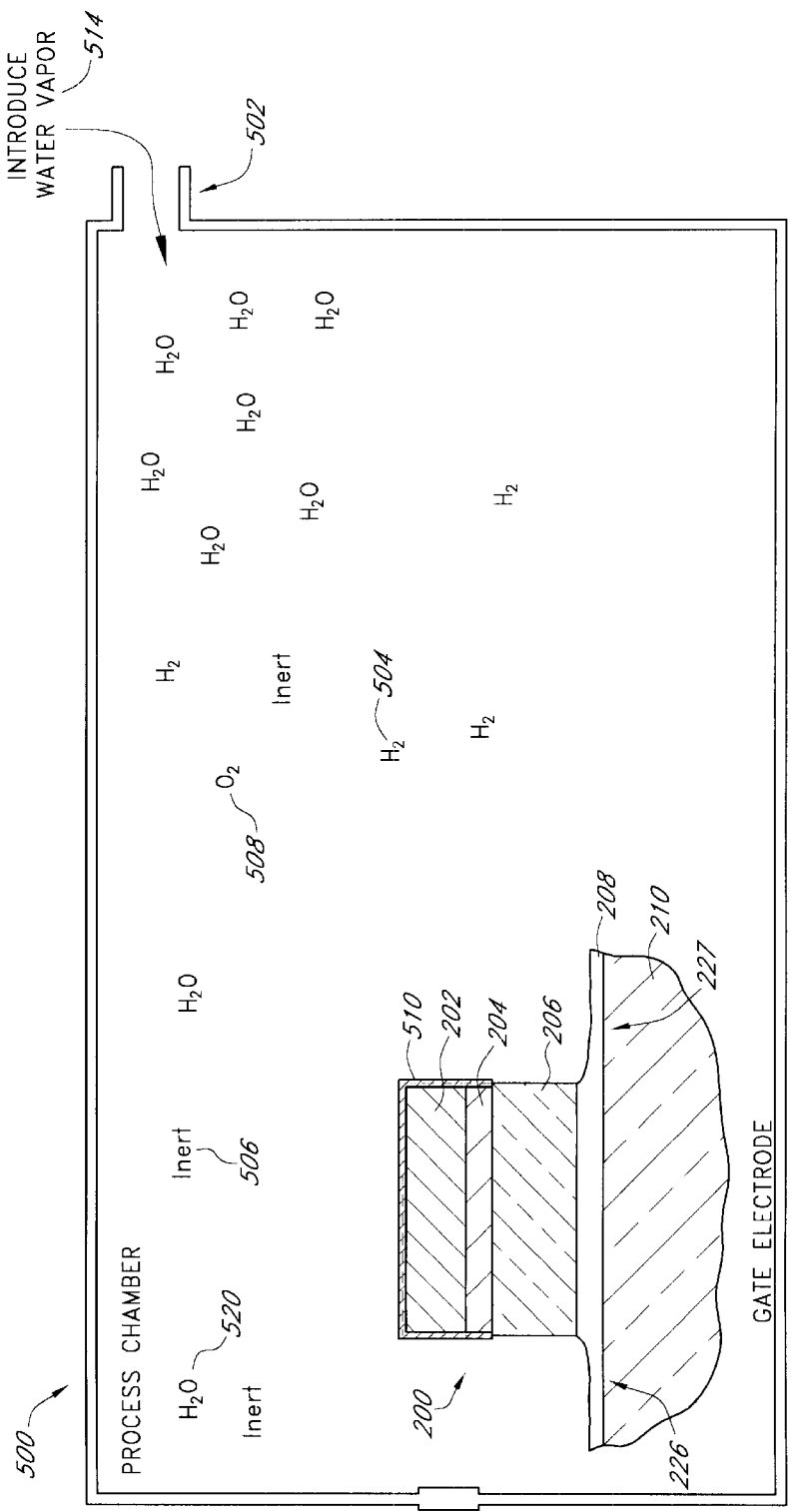

METHOD OF SELECTIVE OXIDATION IN SEMICONDUCTOR MANUFACTURE

BACKGROUND OF THE INVENTION

1. Field of the Invention

The present invention relates to semiconductor fabrication and, more particularly, to selective oxidation of semiconductors, such as silicon, with respect to highly conductive materials such as metals or metal alloys present during gate formation in atmospheric pressure processing.

2. Description of the Related Art

The present-day fabrication of semiconductor devices and circuits is a complex multi-step process. Generally, devices are formed in a semiconductor substrate and additional devices are formed over the substrate. Typically, the upper surface of the substrate will have conductive elements and will also have insulating elements separating the conductive elements. For example, conductive traces and electrodes, such as the gate electrodes of metal-oxide-semiconductor-field-effect transistor (MOSFET) devices, or the interconnecting conductors are formed from a conductive material such as polysilicon or a metal. It is also desirable to oxidize certain components of a semiconductor device; however, such oxidation can result in increased resistance of the conductive elements of the semiconductor device.

This particular problem is illustrated in connection with the formation of metal-oxide-semiconductor-field-effect transistors (MOSFET). The metal-oxide-semiconductor-field-effect transistor (MOSFET), used extensively in electronic devices, has a fundamental structure in which a gate material is formed over a gate oxide, which in turn overlies a semiconductor substrate that is typically single-crystal silicon.

Doped polycrystalline silicon (polysilicon) or doped amorphous silicon is often used in transistor gate construction and imparts desirable conductivity characteristics to the semiconductor device. Some of the more important benefits derived from using polysilicon include its high melting point, low reactivity with gate oxides, and reduced dopant depletion characteristics when compared to that of metals deposited directly over gate oxide.

Polysilicon layers, however, exhibit increased resistivity compared to traditional metal layers and result in higher overall interconnect resistance when used exclusively in gate electrode formation. The increased resistance of polysilicon combined with the continual desire to scale down device dimensions, results in greater power consumption, long propagation delays, and slower access speeds in the small cross-sectional line area through which current can be conducted in the polysilicon layer.

The negative effects encountered when using exclusively polysilicon gates in electrode formation, can be countered by the addition of a highly conductive layer (e.g. metal, metal silicide, and/or metal nitride) over the gate polysilicon. The addition of the highly conductive layer results in a lowering of the overall resistivity of the interconnect lines while retaining the gate integrity provided by polysilicon. Typically, a layer of metal silicide is formed over the polysilicon with an additional metal layer overlying the metal silicide. Alternatively, a metal layer may be deposited directly over the polysilicon, without the intervening metal silicide, depending upon stress and adhesion factors. In either case, the metal layer serves to further reduce the resistivity of the gate stack, reduces the power requirements for each feature, and allows for smaller component size.

As illustrated in FIG. 1A, a classical process of transistor manufacture, known in the prior art, comprises depositing the desired layers on top of a single-crystal silicon substrate 110 on which has been grown a gate oxide layer. The gate electrode is formed in accordance with an integrated circuit design using an etching procedure that removes selected areas and their component layers from the single-crystal silicon substrate 110. The process begins with photolithographic patterning of the area defining the gate electrode to create a resist mask 101. The resist mask 101 protects covered areas below, while adjacent areas 114, that do not have a resist mask layer, are removed by subsequent etching steps. The gate electrode is comprised of a stack of materials that may include: a polysilicon layer 106, a metal nitride layer 104, a metal or metal alloy layer 102 or a stacked combination of these layers.

As illustrated in FIG. 1B, a series of etches, such as plasma etches, are utilized to create a vertical profile defining the sides 112 of the gate electrode 100. Additionally, in some applications, an insulating layer or layers is deposited over the aforementioned layers and is etched at the same time as the underlying layers. The polysilicon layer 106 of the gate structure, typically the last of the stack materials to be etched, is usually etched by fluorine- or chlorine-based plasmas.

When the etching process is complete, the uppermost resist layer 101 of the gate electrode 100 is removed, leaving the layers below intact. The resulting gate stack comprises the metal or metal alloy 102 as the new uppermost layer, with the metal nitride 104 and polysilicon layers 106 below. The process of plasma etching, as well as other anisotropic etching procedures using ion bombardment, may cause considerable physical and chemical damage to the gate oxide 108 underlying the polysilicon layer 106 as well as to the supporting layer consisting of the silicon substrate 110. The resulting damage can be seen as a physical thinning 122 of the gate oxide layer 108 that was exposed to the etching compounds. Thinning of the gate oxide layer 108, particularly at or near the edges of the gate electrode 124A, 124B, renders the gate electrode susceptible to punchthrough or tunneling current leakage. In turn, junction leakage results in increased threshold voltage and unreliable circuit operation. Furthermore, plasma etching tends to damage oxide bonds, creating charge trap sites. Such structural damage extends laterally under the gate edges 124A, 124B as well as over source/drain regions 126, 127. This damage must be repaired by a source/drain reoxidation step to improve the quality and life expectancy of the gate oxide 108. The physical gate edge is also a location of high electric fields which naturally limits the electrical breakdown voltage of the transistor gate, even without the etch damage at the corners.

The reoxidation process typically involves a wet oxidation at temperatures above 800° C. for a relatively long period (in excess of 30 minutes). As shown in FIG. 1C, reoxidation forms an additional layer of oxide 123 over exposed regions of the gate electrode 100 as well as on the surface of the gate oxide 108. Reoxidation results in the gate oxide areas 108 being "repaired" by thickening the oxide layer after etching. Furthermore, the gate electrode corners 124A, 124B are rounded by the formation of an oxide layer and serve to reduce the electric field strength in active areas adjacent to the gate electrode 100.

While the source/drain reoxidation of the gate electrode and surrounding area is a necessary step in transistor manufacture, its use introduces a new problem into the manufacturing process in that the conductive layers 102, 104 present over the gate polysilicon 104 may become overly oxidized. Typically, metals used in gate electrode formation have a low oxidation resistance (particularly tungsten and tungsten nitride). Under the conditions where source/drain oxidation takes place, oxidation of the metal gate electrode will occur concomitantly. Oxidation of the metal produces metal oxides that have insulating properties which are not desirable as the overall resistance of the gate may be radically increased. Longer reoxidation processing times and higher reacting temperatures result in more of the metal or metal alloy layer 102 being consumed, increasing the metal oxide presence 120. Thus, benefits derived from adding a highly conductive metal layer may be attenuated unless the formation of metal oxide 120 can be reduced.

Undesirable oxide formation is a problem that pervades many aspects of integrated circuit/semiconductor manufacture. As described above, there are occasions where components of a device may need to be oxidized in the presence of additional components whose oxidation is undesirable. In such instances, a selective oxidation may be required to oxidize the desired components. Selective oxidation thus employs methods that will preferentially oxidize the desired components while at the same time minimize or prevent oxidation of other components whose properties may be adversely affected by oxidation.

The undesirable oxide formation is often the result of ambient oxygen being present in the chamber when the semiconductor wafer is positioned within the oxidation chamber. Typically, when the chamber is at an elevated temperature, the ambient oxygen present in the atmosphere of the chamber attacks and oxidizes the metal layers of the semiconductor devices, such as the metal gate electrodes of a MOSFET transistor. Hence, even when oxidation techniques that are less aggressive in oxidizing the metal layers are used, there is still a problem with undesired oxidation of the metal layers.

References in the prior art attempt to prevent the problems associated with undesirable oxidation, such as metal gate electrode oxidation, during source/drain oxidation. Metal gate electrode oxidation prevention has been proposed using atmosphere switching. This method involves pumping the process chamber down to a lowered pressure. As a result of the lowered pressure, the atmosphere's gaseous constituents inside the chamber can be altered by backfilling with a new gaseous composition. The use of an inert gas to be used during backfilling has been proposed to reduce the extent to which a metal gate electrode is oxidized. These pressure reduction processes suffer from a number of disadvantages including; 1) increased process time resulting from the requirement to pump and purge the processing and loading chambers; 2) increased complexity and potential for device failure resulting from the atmospheric switching apparatus; and 3) higher cost of ownership both in initial design and purchase of the system as well as ongoing maintenance costs.

Hence, there is an ongoing need for techniques that will allow selective oxidation of materials on a semiconductor device. To this end, there is a need for shielding components or materials of the semiconductor device from unwanted oxidation either during or prior to oxidation of other components or materials of the device in a manner that does not significantly decrease the efficiency of the process for manufacturing the semiconductor device.

SUMMARY OF THE INVENTION

The aforementioned needs are satisfied by the method of selectively oxidizing an element on a semiconductor device of the present invention. In one aspect, the method comprises positioning a semiconductor device in an oxidation chamber and introducing a passivating gas into the chamber wherein the passivating gas is selected to simultaneously interact with the protected element so as to inhibit oxidation of the protected element by oxidants in the chamber (e.g., residual oxygen and air introduced when the chamber is opened).

By both passivating the surface of the protected element prior to S/D reoxidation and employing a selective reoxidation process, oxidation of the protected element in the oxidation chamber can be reduced. In one aspect, the passivating gas comprises a reducing gas such as hydrogen. The passivating gas may also comprise an inert gas such as argon, which does not react with the protected element.

In one illustrated embodiment, the passivating gas is introduced into the oxidation chamber during a temperature ramping process prior to temperature ramp up and its presence is maintained through oxidation and subsequent temperature ramp down. A selective oxidizing species is introduced into the chamber following temperature ramp up to result in a selective oxidation of the semiconductor device. As described, this method of selective oxidation is suitable for accomplishing source/drain oxidation of the semiconductor device in a rapid thermal processor, batch furnace, or other reaction vessel and reduces the amount of undesirable oxidation which takes place due to the presence of oxygen in the ambient atmosphere.

BRIEF DESCRIPTION OF THE DRAWINGS

These and other objects and advantages will become more fully apparent from the following description taken in conjunction with the accompanying drawings which are meant to illustrate and not to limit the invention, and in which:

FIGS. 2A, 2B, 2C, 2D are generalized representations of various gate electrodes representing different embodiments of the present invention.

FIG. 4B is a representation of an atmospheric processing chamber containing the partially fabricated integrated circuit of FIG. 3 during the source/drain oxidative stage of exposure.

DETAILED DESCRIPTION OF THE PREFERRED EMBODIMENT

Figure 1A:
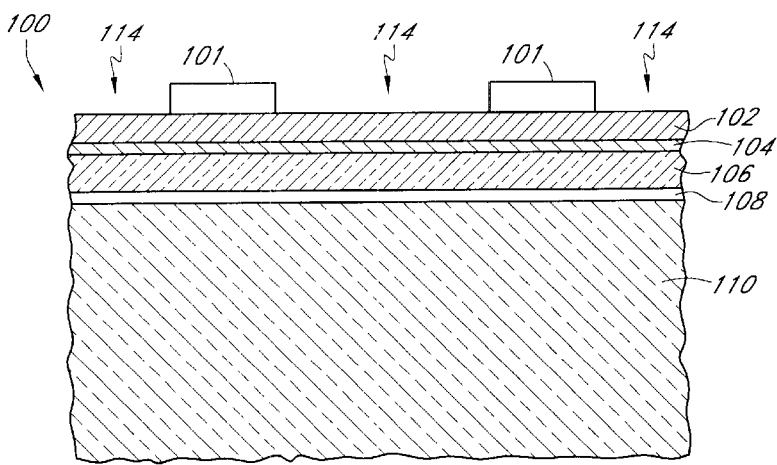
FIGS. 1A, 1B, 1C are partial, cross-sectional representations of a partially fabricated semiconductor device, illustrating a method of gate patterning and source/drain reoxidation in accordance with the prior art.

Reference will now be made to the drawings, wherein like numerals refer to like parts throughout. The illustrated embodiment of the present invention describes a method for passivation of one or more materials and may be used, for example, to passivate the conductive elements present in integrated circuit gate electrodes.

FIGS. 2A–2D illustrate generalized representations of gate electrode stacks 200 which may be selectively oxidized in accordance with the method of the present invention as will be discussed in greater detail hereinbelow. Each gate electrode stack 200 is formed over a gate oxide 208, which in turn overlies a silicon semiconductor substrate 210. As shown in FIG. 2A, the gate electrode stack 200 may comprise a polysilicon layer 206 over which a metal nitride 204 resides. Additionally, as shown in FIG. 2B, an insulating layer 90, may further overlay the previous layers 204, 206, 208, 210. Another gate electrode stack 200, shown in FIG. 2C, may be formed from by the addition of a metal or metal alloy layer 202 over the existing layers of the gate stack 204, 206, 208, 210. As shown in FIG. 2D, an insulating layer 90 may further overlay the previous layers 202, 206, 208, 210. Typically, those gate structures 200 which contain an insulating layer 90 may be used in memory applications while those gate structures 200 which lack the insulating layer 90 may be used in logic applications.

In each of the above-mentioned embodiments, different oxidation requirements may exist in the vertical gate stack 200. In one aspect, the polysilicon layer 206 and silicon substrate 210 are desirably oxidized in the presence of the other metal, metal nitride, or metal alloy layers which should be "protected" from oxidation to prevent degradation of conductivity. The presence of a strongly oxidizing species, which in one aspect may comprise oxygen or other oxidizing contaminants residually present in the atmosphere to which the gate stack 200 is exposed, undesirably reacts with the gate stack layers in the absence of a passivating agent 22. To prevent undesirable oxidation of the gate stack, the passivating agent 22 is introduced into the atmosphere to which the gate stack 200 is exposed. In one aspect, the passivating agent 22 functions to protect the metal, metal nitride, or metal alloy layers from oxidation by oxygen in the ambient. Additionally, when a proper amount of the passivating agent 22 is present, the passivating agent 22 can react with the strongly oxidizing species to form a less aggressive (more selective) oxidizing agent 28. As a result, the oxidizing agent 28 selectively oxidizes certain components, such as the polysilicon layer 206 and silicon substrate 210, while leaving other components, such as the metal, metal nitride, or metal alloy layers in an unoxidized state.

As will be subsequently discussed in detail, the introduction of the passivating agent into the atmosphere where the oxidation takes place is performed concomitantly with the introduction of the gate stack into a reaction vessel or chamber. It is during this time that oxygen present in the ambient atmosphere where the reaction vessel is housed may enter the reaction vessel and result in oxidation of the gate stack, particularly of metallic layers such as tungsten and tungsten nitride. Thus, under the elevated temperature conditions where oxidation takes place, the gate stack is protected from nonspecific oxidation beginning with the loading of the substrate into the chamber until it is subsequently unloaded for further steps of fabrication.

In one embodiment, the passivating agent 22 comprises a gas, such as hydrogen, that forms the barrier layer 24 of hydrogen-terminated metal or metal alloy. Preferably, the atmospheric chamber is at an elevated temperature, e.g., on the order of 500° C. At this temperature, at least some of the excess oxygen in the chamber that would otherwise oxidize those components of the gate stack which desirably are to remain in an unoxidized state combines with the hydrogen so as to form gaseous water that is a less aggressive oxidizer of the metal or metal nitride layers.

In a subsequent oxidation step, additional oxidizing agent 28 is introduced into the environment surrounding the gate stack 200 to increase the concentration of oxidizing agent 28 to a level where efficient selective oxidation of the gate stack 200 will take place. The oxidizing agent 28 may comprise one or more compounds that selectively oxidize the poly and substrate silicon. In one aspect, the oxidizing agent 28 does not appreciably oxidize the metal, metal nitride, or metal alloy layers due to: (1) the formation of a passivating layer surrounding those layers which are to desirably remain unoxidized, (2) the less aggressive oxidizing nature of the oxidizing agent 28, (3) the regenerative ability of the passivating layer in removing oxidation, or a combination thereof. Thus, an intentional selective oxidation of the gate stack 200 can be accomplished wherein selected components of the gate stack are desirably protected from oxidation during processing and other components are desirably oxidized, as will be shown in greater detail in subsequent figures.

The selective oxidation of components in an electronic device such as, for example, a gate electrode for a MOSFET transistor, can be achieved using this method. The invention has particular utility for protecting components in DRAM logic circuits, which are particularly sensitive to loss of word line and bit line conductivity. Although the preferred embodiments are discussed in terms of gate electrodes for DRAM transistor circuits, those having skill in the art of integrated circuit fabrication may find application for the present invention for electrodes or conduction lines subject to oxidation or other corrosion in different contexts without departing from the spirit of the present invention.

As discussed in the "Background" section above, DRAM transistor gate electrodes often comprise conductivity-doped polysilicon strapped with one or more highly conductive layers to lower total interconnect resistance. The conductive straps generally contain metal, such as metal, metal nitride or metal silicide, in various combinations. The metals in these layers may exhibit low oxidation resistance and, as a result, may be rendered susceptible to oxidation wherein a significant amount of the metal is consumed, forming metal oxide. Metal oxide formation deteriorates the benefits derived from addition of the high conductivity layer and its formation should be minimized during source/drain reoxidation. Metals that are used to form high conductivity layers, which exhibit low oxidation resistance, include, but are not limited to, tungsten (W), cobalt (Co), molybdenum (Mo), copper (Cu), aluminum (Al), aluminum/copper alloy, tantalum (Ta), titanium (Ti), vanadium (V), and titanium/vanadium alloy.

The gate stack may comprise a metal/poly stack, a metal nitride/poly, a metal/metal nitride/poly, a metal/silicide/poly stack, and silicide/poly, among other possible combinations. Particular examples of materials include $WN_x$/poly, $W/WN_x$/poly, W/TiN/poly, $WSi_x$/poly, $TiSi_x$/poly, W/poly, Ti/poly, $W/WSi_x$/poly, etc. In triple layer gate stacks, metal silicides may be sandwiched between metal and poly layers to improve adhesion among the layers and reduce stress within the composite gate stack. It should also be noted that the gate stack might include more than one type of metal, such as a $W/TiSi_x$/poly stack. As will be apparent from the following discussion, all of these combinations of gate materials can be protected from increased oxidation using the oxidation-reduction method described herein.

Figure 1B:
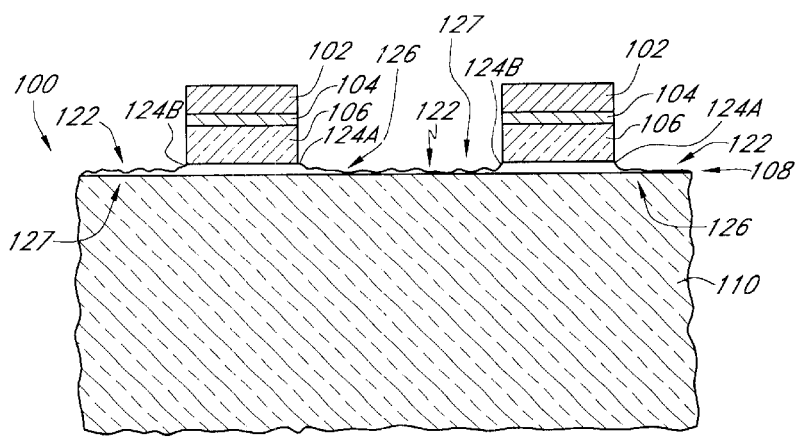
Figure 1C:
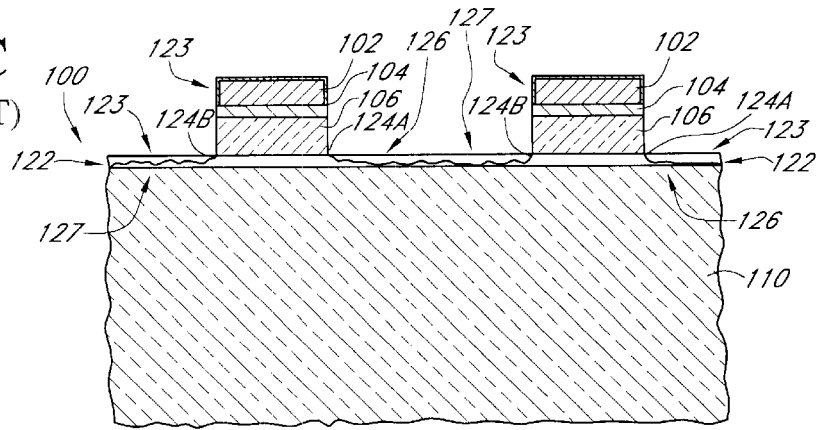
Figure 3:
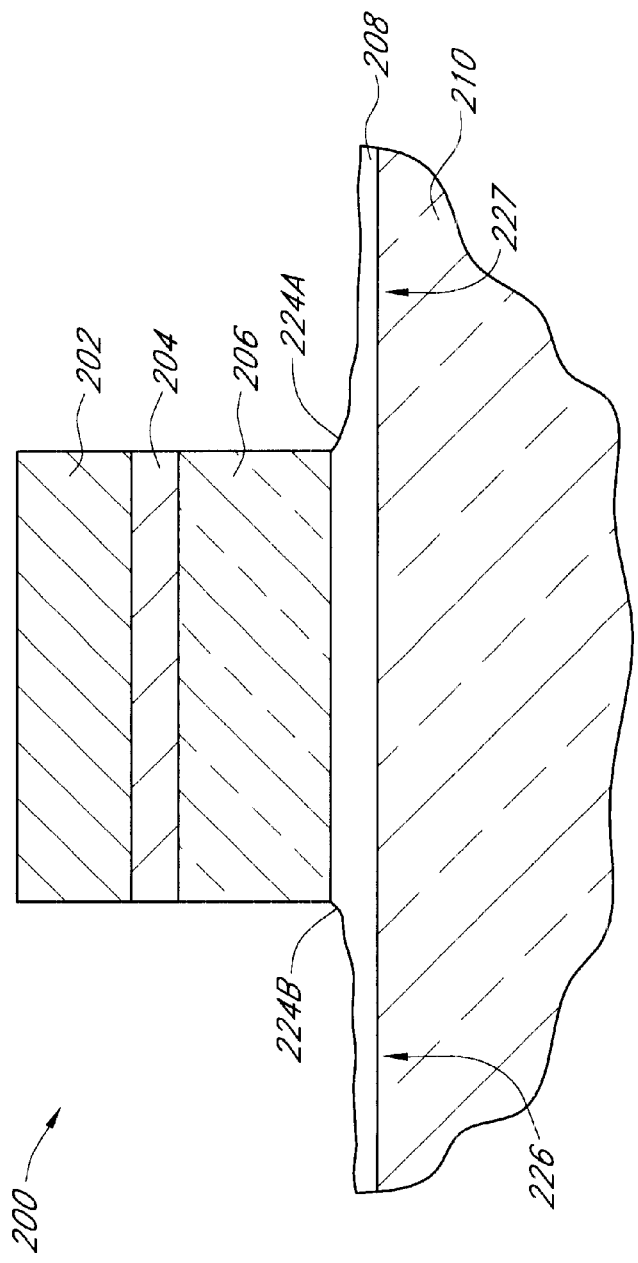
FIG. 3 is a representation of a partially fabricated semiconductor device, illustrating the method of oxidizing source and drain regions in a preferred embodiment of the present invention.

FIG. 3 illustrates a patterned gate electrode stack 200 in accordance with preferred embodiments of the present invention. As with prior art gates, the preferred gate electrode 200 is formed over a gate oxide 208, which in turn overlies a semiconductor substrate 210, such as a single-crystal silicon wafer. Once active areas have been isolated by formation of, for example, one or more field oxide regions, the gate oxide 208 is thermally grown on the substrate 200. Conductive layers, comprising, in this embodiment, the polysilicon layer 206, the metal nitride layer 204, and the metal or metal alloy layer 202, which make up the electrode stack 200 are then deposited in the same manner as illustrated in FIGS. 1A–1C. Though an insulating cap layer may also be formed at this stage, to be etched along with the conductive layers, the gate electrode 200 is illustrated without an insulating cap, for simplicity of discussion. In one embodiment, the gate oxide 208 has a thickness of less than about 200 Å, most preferably about 70 Å. The polysilicon layer is preferably between about 100 Å and 1,500 Å thick, most preferably about 800 Å. The metal nitride layer is preferably between about 10–1000 Å thick and preferably about 150 Å. The thickness of the metal layer is preferably between about 200 Å and 1,500 Å, most preferably about 400 Å.

After the layers comprising the polysilicon layer 206, the metal nitride layer 204, and the metal or metal alloy layer 202 have been formed over the silicon substrate 210, the layers are selectively masked with the addition of the resist layer (not shown), using known photolithographic techniques, and etched through to expose the gate oxide 208 over transistor source 226 and drain 227 regions. In accordance with current processing technology the polysilicon layer 206 is etched by plasma etch technologies. Regardless of the particular etch, exposure to plasma etch in general causes damage to the gate oxide 208 in the source/drain regions 226, 227, particularly near gate corners 224A, 224B. As mentioned in the "Background" section above, this damage must be repaired by a high-temperature source/drain reoxidation, at temperatures of about 900° C., as is known in the art of integrated circuit fabrication.

While the regions of the gate oxide 208 comprising the source 226 and drain 227 are desirably oxidized to regenerate the material lost by previous etching steps, the highly conductive layers 202, 204 of the gate stack 200 should retain their substantially unoxidized state throughout the oxidation process. Oxidation of the highly conductive layers 202, 204 is not desirable because of the increase in resistivity associated with oxide formation on the metal or metal alloy layer 202 and the metal nitride layer 204, which degrades the conductivity imparted by the addition of these layers. The method of protecting the highly conductive metal or metal alloy layer 202 of the gate stack prior to source/drain oxidation of the illustrated embodiment utilizes a passivating gas that is selected to minimize oxidative damage to the metal or metal alloy.

More particularly, a passivation step, in accordance with a first embodiment, comprises passivation of the exposed surfaces of a gate stack by addition of a passivating gas, such as hydrogen, along with an inert gas, if desired, into the sealed atmospheric processing chamber by way of an opening or valve so as to prevent further entrance of any atmospheric oxidants and the attendant risk of explosion or sparking. The inert gas may be any non-reacting gas that does not interfere with the passivation process, of which argon may be used. The passivation step is desirably performed in a sealed furnace, rapid thermal processor, or using a hydrogen plasma anneal treatment (in a low pressure environment) where the temperature should preferably be maintained between about 600° C. and 1000° C. for between about 10 seconds and 2 hours, depending upon the particular materials used for the gate stack. Most preferably, the passivation and selective oxidation described herein are performed in an atmospheric chamber, eliminating costly pumping steps. Parameters should be adjusted within the above ranges to produce hydrogen-termination and passivation of the metal nitride and metal or metal alloy to the extent of preventing oxidation.

The addition of the hydrogen gas to the atmospheric processing chamber imbues the metal materials with a layer of hydrogen-terminated metal complex. The resulting hydrogen-terminated metal layer desirably forms a good barrier against oxidation. Passivation, in this embodiment, thus comprises formation of a hydrogen-terminated metal, metal nitride, or metal alloy layer over exposed surfaces of the metal, metal nitride, and metal alloy layers of the gate stack. Although hydrogen gas is used as a passivating agent in this embodiment, it should be appreciated that other elements, compounds or mixtures may exist which impart a protective effect against oxidation such as for example; ammonia gas, a mixture of hydrogen and ammonia gases, a mixture of hydrogen and oxygen gases, a mixture of ammonia and oxygen gases, a mixture of hydrogen, ammonia, and oxygen gases, among other possible combinations.

Figure 4A:
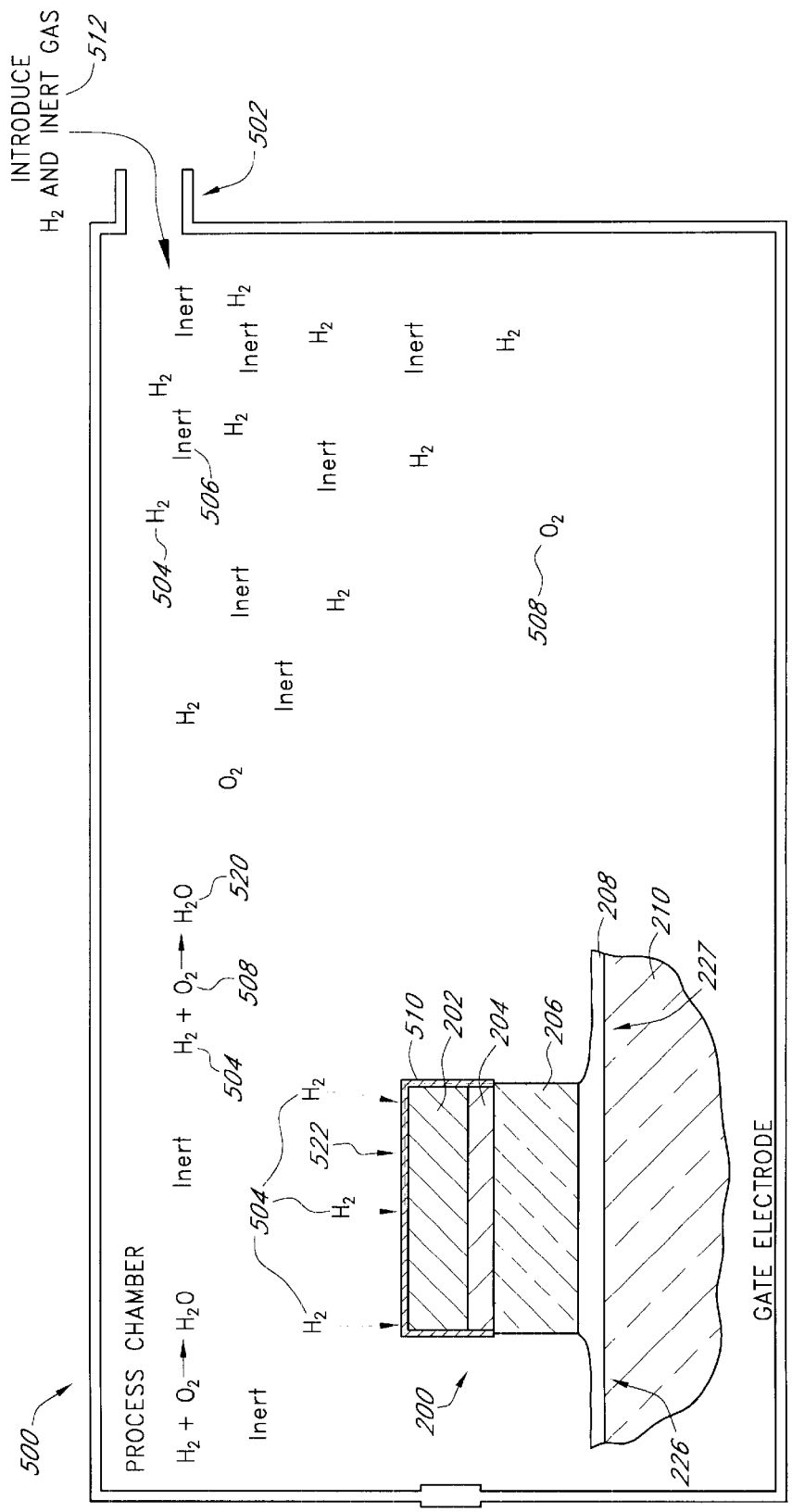
FIG. 4A is a representation of an atmospheric processing chamber containing the partially fabricated integrated circuit of FIG. 3 during a first protective stage of exposure.

FIGS. 4A and 4B illustrate in greater detail the method by which the hydrogen terminated metal, metal nitride or metal alloy layer is formed and subsequently used to protect the metallic substrate from oxidation using an atmospheric processing chamber. The gate electrode 200, as shown in FIG. 4A, is maintained in an atmospheric processing chamber 500 during the termination/passivation process as well as the source/drain oxidation. The atmospheric processing chamber 500 may comprise a furnace, rapid thermal processor or other suitable device capable of maintaining the high temperatures necessary to initiate source/drain oxidation. The chamber 500 is generally kept at an elevated idling temperature, e.g., on the order of 500° C. to 1000° C. more preferably 550° C. to 700° C. (650° C. in preferred embodiment), so as to permit subsequent rapid source/drain reoxidation. While the method is also suitable for use, however, when the chamber is kept at lower (ambient) temperatures and subsequently heated through a temperature ramp, the invention can advantageously reduce ramp time by permitting higher idling temperature while protecting sensitive metallic materials from oxidation. At the time the semiconductor device incorporating the gate electrode 200 is positioned within the chamber 500, there is free oxygen present within the chamber 500 that can result in undesired oxidation of the gate electrode 200. However, as will be described below, the introduction of the passivation gas results in reduced oxidation of the gate electrode 200.

The termination/passivation process is initiated by introducing passivating gas comprising hydrogen gas 504 along with an inert gas 506 into the chamber through a valve 502. In this embodiment, the composition of the gaseous mixture 512 is between about 10% and 100% hydrogen 504 with the balance consisting of inert gas, such as argon 506. Additionally, the temperature of the chamber 500 is ramped up from the idle temp, as needed, to achieve a desirable reaction temperature where selective oxidation will take place. Selective oxidation is preferably conducted between about 600° C. and 1000° C., most preferably at about 800° C. The temperature is more preferably ramped to between about 700° C. and 900° C., for between about 1 minute and 30 minutes, most preferably about 20 minutes. During this stage, passivating gas, comprising hydrogen gas 504, is adsorbed onto the material desirably protected from oxidation, such as the highly conductive metal or metal alloy layer 202 of the gate electrode 200 and the metal nitride layer 204, forming a passivating layer 510, which comprises a hydrogen-terminated metal in the preferred embodiment, that surrounds the metal layer 202 and the metal nitride layer 204. The hydrogen-terminated metal nitride, metal or metal alloy layer 510 advantageously protects the underlying metal or metal alloy layer 202 from oxidation in a number of ways, as will be discussed in detail below.

During the termination/passivation process, an oxidatively reactive species, such as contaminant or residual oxygen 508, present in the atmospheric process chamber 500 diffuses through the surface of the material that is desirably protected from oxidation, such as the high conductivity metal layer 202 and the metal nitride layer 204. In addition to passivation, it is believed that the passivating species reacts with the oxidatively reactive species 508 and is converted to a less aggressive oxidizing species, such as water 520. The newly formed water molecules 520 are a less aggressive oxidizing compound relative to the original oxygen molecules 508 from which they were derived and do not oxidize the metal or metal alloy layer 202 or the metal nitride layer 204 as quickly.

Formation of the hydrogenated-terminated passivation layer 280 advantageously does not consume the highly conductive metal, metal nitride or metal alloy, which it protects. Additionally, the passivating layer 510 does not impart adversely altered chemical reactivity characteristics to the material it was intended to protect 202 or impose structural limitations to the gate electrode 200. Therefore, formation of the passivating layer does not significantly hinder subsequent steps typically involved in processing the transistor gate stack 200 for use in integrated circuit manufacture.

The passivating layer can also serve to reconstitute the material it was intended to protect from oxidation. Without being limited by theory, the inventors believe the hydrogen-terminated metallic layer 510 can react with oxides formed on the metallic sublayer 202 or metal nitride sublayer 204 and produces the original metal 202, metal alloy, or metal nitride 522 present on the gate electrode 200. In this instance, a reduction of the metal, metal alloy oxide, or metal nitride 522 will occur under the specified reaction conditions. The reduction of metal from metal oxide or metal nitride from metal oxynitride readily proceeds as hydrogen 504 is introduced into the atmospheric processing chamber and reacts with the metal oxide 522 to form water 520 and the original metal or metal alloy layer 202, 204 of the gate electrode 200.

As shown in FIG. 4B, subsequent to the addition of the hydrogen/inert gas mixture 512 protecting the highly conductive layers 202 of the gate electrode 200 and the concurrent temperature ramp needed to achieve the desirable reaction temperature, the wet oxidation of the source/drain regions 226, 227 of the gate electrode 200 takes place in the presence of the passivating gas which is maintained at appropriate concentrations within the processing chamber. A selective oxidizing species, such as water vapor 514 is introduced into the processing chamber 500 through the chamber valve to initiate the oxidation reaction. In accordance with known reoxidation processes, the material comprising the gate electrode 200 is exposed to a wet thermal oxidation conducted between about 600° C. and 1000° C., more preferably between about 700° C. and 900° C., most preferably at about 800° C., for between about 5 minutes and 200 minutes, most preferably about 60 minutes. As is known in the art, hydrogen is still provided along with water to result in the selective oxidation. In this embodiment, the metal or metal alloy 202 of the hydrogen-terminated gate electrode 200 is not subject to as much oxidation during this step as a result of the protective passifying layer 510 while the oxidation of the poly 206 and source/drain regions 226, 227 of the gate electrode 200 occurs in a controlled and unhindered manner. When the poly 206 and source/drain regions 226, 227 of the gate electrode 200 have been sufficiently oxidized, the process may be terminated, the temperature of the chamber ramped down and the gate electrode 200 removed from the process chamber 500 for subsequent processing such as addition of a protective cap structure to the gate electrode 200.

During the oxidation and the temperature ramp down described above, the passivating gas concentration is maintained by continued flow of the passivating gas into the chamber to insure the gate electrode is protected until the chamber temperature reaches a desired cool-down temperature. The chamber is then opened and the flow of passivating gas into the chamber is terminated.

Figure 5:
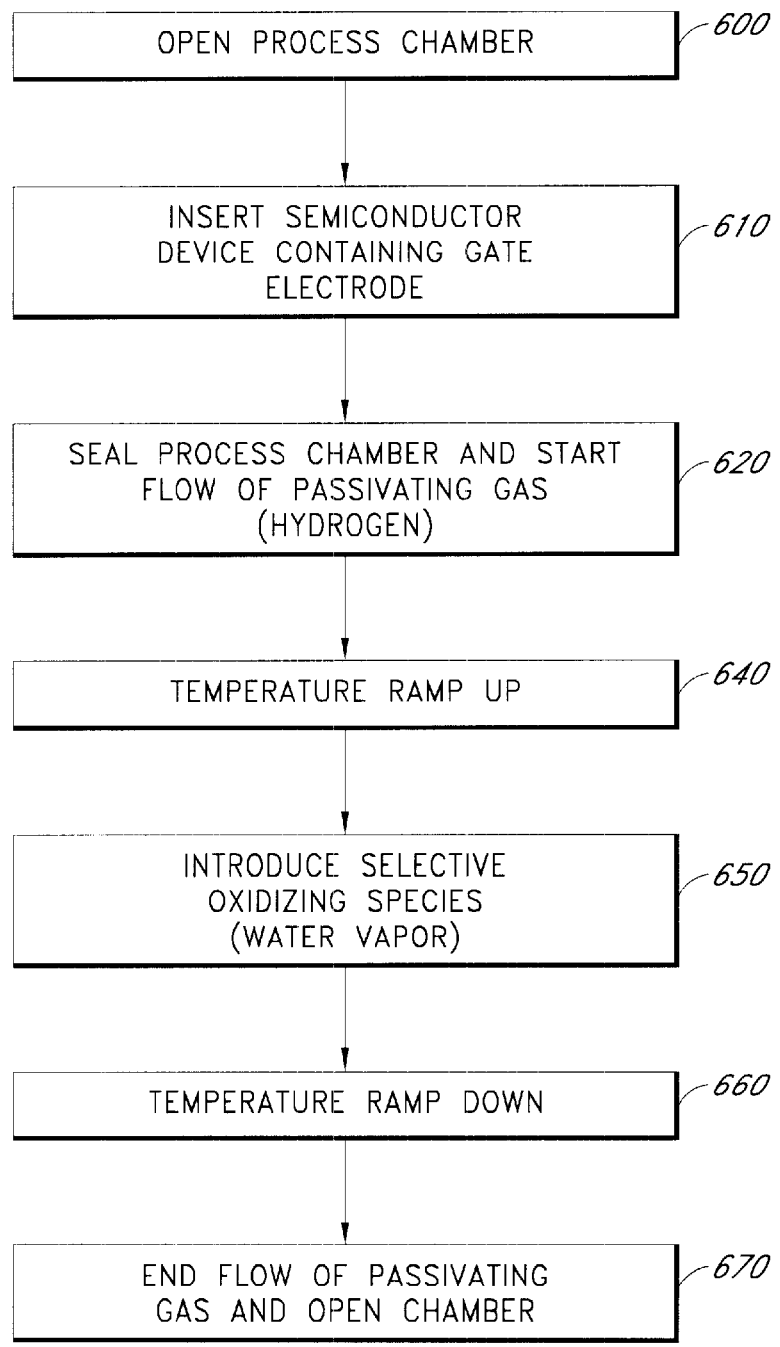
FIG. 5 is a flow chart generally illustrating processes in accordance with the present invention.

With reference to FIG. 5, a flow chart generally illustrates the process described above using a temperature ramping process to accomplish the source/drain oxidation of the gate electrode 200. The process begins with an open process chamber 600 wherein the gate electrode 200 is placed within the process chamber 610. The process chamber 500 may be maintained at an elevated or ambient temperature as described above. Oxygen 508 present in the atmosphere outside the chamber may be introduced into the chamber atmosphere, creating later problems of oxidation of the metal nitride 204, metal, or metal alloy 202.

Upon sealing the process chamber 620, the passivating gas is introduced into the chamber 500 by way of the valve, preventing further entrance of oxygen into the chamber 500. As indicated above, in one aspect, the passivating gas preferably comprises a reducing gas such as hydrogen or ammonia, more preferably hydrogen with or without the addition of an inert gas such as argon. The presence of the passivating gas in the process chamber 500 is maintained through a temperature ramp up of the chamber 640 to a desired temperature where source/drain oxidation will take place. While the passivating gas is present in the process chamber 500, the gate electrode 200 is desirably protected from oxidation by oxygen. Subsequently, a selective oxidizing environment is introduced into the process chamber 650. The selective oxidizing environment preferably comprises water vapor and continued flow of a reducing agent ($H_2$), introduced in sufficient quantity to efficiently react with those components of the gate electrode which are to be desirably oxidized. The process is completed as the temperature of the process chamber is ramped down 660 after which time the chamber is openned and the passivating gas flow terminated 670. During the temperature ramp down process 660, the passivating gas introduction into the chamber, is maintained to continue to protect the gate electrode 200 until such time as the gate electrode 200 is no longer susceptible to oxidation by the oxygen present in the process chamber 500.

Figure 6:
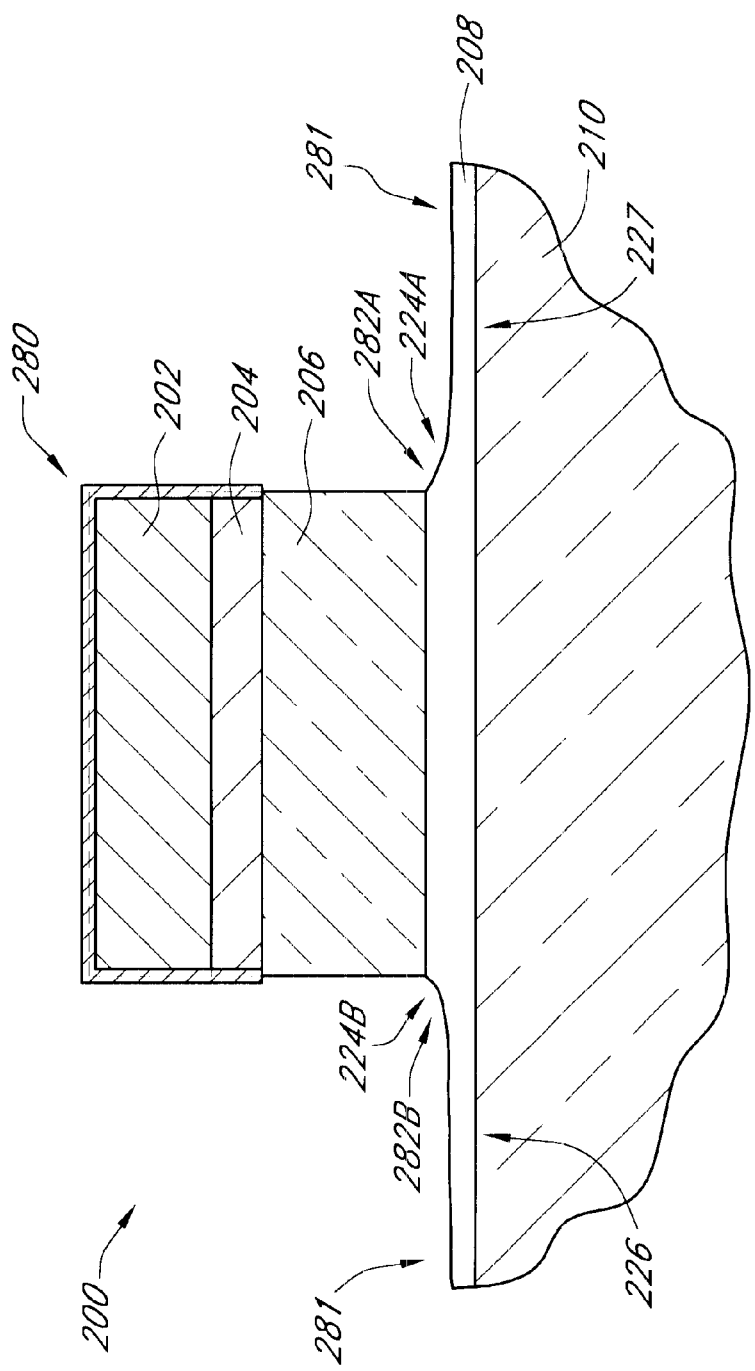
FIG. 6 is a representation of a partially fabricated integrated circuit of FIG. 4 following source/drain oxidation

FIG. 6 illustrates the details/structure of the gate electrode 200 following the hydrogen passivaton and source/drain reoxidation. The reoxidized gate oxide 281 thickens the original gate oxide layer 208 to repair damage to the gate oxide 208 sustained during the gate patterning etch step of manufacture. The high quality reoxidized gate oxide 281, having a preferred thickness of between about 10 Å and 150 Å, most preferably about 60 Å, is located in the area over the source/drain 226, 227 regions of the silicon substrate 210. The reoxidized gate oxide 281 further collects in each gate corner 224A, 224B forming slight oxide buildups 282A, 282B thereby rounding the corners 224A, 224B and reducing operational lateral field strength. Thus, hot carrier injection into the gate oxide 208 is reduced, prolonging the useful life of the device.

Further illustration of the source/drain reoxidation process can be shown by way of the following example, which represents a typical case during manufacture using selective oxidation of the gate electrode 200. After the etch of the gate stack 200, the remaining gate oxide 208 is typically 20–50 Å thick, depending on the gate etch conditions and the initial oxide thickness. The selective oxidation typically grows 15 Å–50 Å. Therefore, if 30 Å of remaining gate oxide 208 was left on the substrate silicon 210 after gate etching and the substrate area was then treated with a 30 Å selective oxidation, the final reoxidized gate oxide would be about 60 Å.

Preservation of the metal, metal nitride, or metal alloy by hydrogen-terminated passivation is important to insure minimal degradation of the high conductivity layer 202, 204 since these layers carry the majority of current for the interconnect. The resulting hydrogen-terminated metal layer 280 protects the underlying metal or metal alloy layer 202 and the metal nitride layer 204 during the high temperature wet reoxidation of the poly 206 and source/drain 226, 227 regions of the gate electrode 200 and has a lower overall resistivity, as compared to prior art gates of similar materials. Furthermore, the reoxidized gate oxide 281 demonstrates a low defect density for reliable transistor operation.

Hence, the illustrated embodiment provides a process by which conductive elements, such as metal layers in gate stacks, can be protected during oxidation of other components on a semiconductor device. The use of a-passivating gas, such as hydrogen, that produces a coating comprised of a passivation layer, such as a hydrogen-terminated layer, reduces oxidation of the protected layer as a result of inhibiting penetration of the oxidizing species into the protected layer. Moreover, the passivating gas and process parameters can also be selected so as to react with residual oxidizing species to as to transform the oxidizing species into a less aggressive oxidizing species that will be less likely to oxidize the protected layer. Further, the passivating species can also be selected such that it will react with portions of the protected layer which are oxidized to thereby transform the oxidized material of the protected layer into the desired non-oxidized material.

As discussed above, this process has specific application in the process of manufacturing transistors as the metal layers of the gate stack can be protected during the source/drain reoxidation process. However, it will be appreciated that this process can be used in a number of different implementations where there is a layer or structure that should desirably be protected from oxidation during oxidation of a different component of an electronic device. This can include, for example, protection of conductors, electrodes and the like during oxidation processes.

Although the foregoing description of the invention has shown, described and pointed out novel features of the invention, it will be understood that various omissions, substitutions, and changes in the form of the detail of the apparatus as illustrated, as well as the uses thereof, may be made by those skilled in the art without departing from the spirit of the present invention. Consequently the scope of the invention should not be limited to the foregoing discussion but should be defined by the appended claims.

We claim:

1. A method of selectively oxidizing an element on a semiconductor device while inhibiting oxidation of a protected element of the semiconductor device, the method comprising:

positioning the semiconductor device in an oxidation chamber;

concomitantly introducing a passivating gas into the oxidation chamber prior to selective oxidation, wherein oxidation of the protected element is inhibited by the passivating gas that is selected to react with ambient oxygen present in the reaction chamber which would otherwise oxidize the protected element of the semiconductor device.

2. The method of claim 1, wherein the passivating gas is a reducing gas.

3. The method of claim 2, wherein the reducing gas is selected from the group consisting of hydrogen, ammonia or a combination thereof.

4. The method of claim 1, wherein the passivating gas further comprises an inert gas.

5. The method of claim 4, wherein the inert gas further comprises argon.

6. The method of claim 1, wherein positioning the semiconductor device in an oxidation chamber comprises positioning the semiconductor device in a furnace.

7. The method of claim 1, wherein positioning the semiconductor device in an oxidation chamber comprises positioning the semiconductor device in a rapid thermal processing chamber.

8. The method of claim 1, wherein the oxidation chamber is sealed following positioning of the semiconductor device in the chamber.

9. The method of claim 8, wherein after sealing the oxidation chamber, the passivating gas is introduced into the oxidation chamber.

10. The method of claim 1, further comprising ramping up the temperature while introducing the passivating gas.

11. The method of claim 1, further comprising ramping down the temperature after selective oxidation while introducing the passivating gas.

12. The method of claim 1, wherein introducing the passivating gas comprises introducing hydrogen while ramping the substrate temperature from an idling temperature to a selective oxidation temperature.

13. The method of claim 12, wherein the idling temperature is approximately 500° C.–1000° C.

14. The method of claim 1, wherein the oxidation chamber comprises oxygen upon loading the semiconductor device.

15. The method of claim 1, wherein selectively oxidizing comprises introducing a selective oxidizing agent into the oxidizing chamber while continuing to flow the passivating gas.

16. The method of claim 15, wherein the selective oxidizing agent comprises water.

17. The method of claim 16, wherein selectively oxidizing comprises setting the semiconductor device temperature to between about 600° C. and 1000° C.

18. The method of claim 17, wherein selectively oxidizing comprises setting the semiconductor device temperature to between about 700° C. and 900° C.

19. The method of claim 1, wherein the semiconductor device comprises a protected element including a metal selected from the group consisting of tungsten, cobalt, molybdenum, copper, aluminum, aluminum/copper alloy, tantalum, tantalum nitride, titanium, titanium nitride, vanadium, titanium/vanadium alloy, tungsten nitride, or a combination thereof.

20. The method of claim 1, wherein the semiconductor device comprises a transistor gate stack.

21. The method of claim 20, wherein the gate stack comprises a stacked layer of materials selected from the group consisting of WN$_x$/poly, W/WN$_x$/poly, W/TiN/poly, WSi$_x$/poly, TiSi$_x$/poly, W/poly, Ti/poly, W/WSi$_x$/poly, or a combination thereof.

22. The method of claim 1, wherein the semiconductor device additionally comprises an insulating cap formed over the protected element.

23. The method of claim 1, wherein the semiconductor device includes logic transistors of a dynamic random access memory (DRAM) circuit.

24. The method of claim 23, wherein selectively oxidizing a source and drain regions while protecting metallic elements in the transistors.

25. The method of claim 1, wherein the oxidation chamber comprises a single semiconductor processing chamber.

26. The method of claim 1, wherein the oxidation chamber comprises a batch substrate processing chamber.

27. A method of oxidizing a semiconductor device partially fabricated on a semiconductor substrate while inhibiting oxidation of a protected element on the semiconductor device, the method comprising:

loading the semiconductor substrate in an atmospheric chamber at a first temperature, wherein the atmospheric chamber includes residual oxygen that would oxidize the protected element at the first temperature; and introducing a passivating gas into the atmospheric chamber at the time the semiconductor substrate is loaded so as to inhibit oxidation of the substrate by the ambient atmosphere and maintaining the presence of the passivating gas in the atmospheric chamber while changing the substrate temperature.

28. The method of claim 27, wherein changing the temperature comprises increasing the substrate temperature.

29. The method of claim 28, wherein changing the temperature further comprises decreasing the substrate temperature.

30. The method of claim 29, further comprising selective oxidation of the semiconductor device between increasing and decreasing the substrate temperature.

31. The method of claim 30, wherein the selective oxidation comprises setting the substrate temperature at between approximately 700° C. and 900° C.

32. The method of claim 27, wherein the semiconductor substrate comprises source and drain regions formed therein with a transistor gate stack including a metal conductive layer formed thereon.

33. The method of claim 32, wherein the gate stack comprises a stacked layer of materials selected from the group of WN$_x$/poly, W/WN$_x$/poly, W/TiN/poly, WSi$_x$/poly, TiSi$_x$/poly, W/poly, Ti/poly, W/WSi$_x$/poly, or a combination thereof.

34. The method of claim 33, wherein the gate stack additionally comprises an insulating cap formed over the protected element.

35. The method of claim 34, wherein the gate stack forms part of a dynamic random access memory (DRAM) circuit.

36. The method of claim 32, further comprising reoxidizing the source and drain regions at a steady state temperature.

37. The method of claim 36, wherein reoxidizing the source and drain region comprises wet-oxidizing the source and drain regions of the semiconductor device.

38. The method of claim 27, wherein the passivating gas is a reducing gas.

39. The method of claim 38, wherein the reducing gas is selected from the group consisting of hydrogen, ammonia or a combination thereof.

40. The method of claim 39, wherein the passivating gas further comprises an inert gas.

41. A method of selectively oxidizing a selected metal element on a semiconductor device while inhibiting oxidation of a protected element of the semiconductor device, the method comprising:

positioning the semiconductor device in a process chamber at a temperature selected to inhibit oxidation of the selected metal element while introducing a passivating gas to further inhibit oxidation of the semiconductor device by ambient oxygen present in the atmosphere of the chamber;

introducing a reducing gas into the oxidation chamber such that the reducing gas interacts with the selected metal element to form a passivated protection layer over the exposed surfaces of the selected metal element;

ramping up the temperature of the device to an oxidation temperature while continuing to flow the reducing gas; and initiating a selective oxidation process upon elements of the semiconductor device at the oxidation temperature wherein the passivated protection layer inhibits oxidation of the selected metal element.

42. The method of claim 41, wherein the semiconductor device comprises a transistor gate stack over a semiconductor substrate.

43. The method of claim 42, wherein the gate stack comprises a stacked layer of materials selected from the group of WN$_x$/poly, W/WN$_x$/poly, W/TiN/poly, WSi$_x$/poly, TiSi$_x$/poly, W/poly, Ti/poly, W/WSi$_x$/poly, or a combination thereof.

44. The method of claim 41, wherein ramping the temperature comprises increasing the device temperature to between about 600° C. and 1000° C.

45. The method of claim 44, wherein ramping the temperature comprises increasing the device temperature to between about 700° C. and 900° C.

46. The method of claim 41, wherein ramping the temperature comprises increasing the device temperature from between about 550° C. and 700° C.

47. The method of claim 41, wherein ramping the temperature comprises increasing the device temperature from ambient room temperature.

48. The method of claim 41, wherein introducing the reducing gas comprises introducing hydrogen gas at a concentration of approximately 10%–100%.

49. The method of claim 41, further comprising introducing an inert gas into the chamber while hydrogen is being introduced into the chamber.

50. The method of claim 41, wherein initiating the selective oxidation comprises delivering steam into the chamber to wet oxidize the selected element.

51. The method of claim 41, further comprising continuing to flow the reducing gas during the selective oxidation.

52. The method of claim 51, further comprising continuing to flow the reducing gas while ramping down the device temperature after the selective oxidation.

53. The method of claim 41, wherein the reducing gas comprises hydrogen, the selective oxidation comprises a wet oxidation, and flowing the reducing gas within the chamber prior to, after and during the selective oxidation.

* * * * *